United States Patent
Knee et al.

(10) Patent No.: US 11,533,032 B2
(45) Date of Patent: Dec. 20, 2022

(54) SUPERCONDUCTING OUTPUT AMPLIFIERS WITH INTERSTAGE FILTERS

(71) Applicant: Microsoft Technology Licensing, LLC, Redmond, WA (US)

(72) Inventors: Derek Leslie Knee, Fort Collins, CO (US); Jonathan D. Egan, Hanover, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/214,143

(22) Filed: Mar. 26, 2021

(65) Prior Publication Data

US 2022/0311401 A1    Sep. 29, 2022

(51) Int. Cl.
*H03F 19/00* (2006.01)
*H03F 1/02* (2006.01)
*H03K 19/195* (2006.01)

(52) U.S. Cl.
CPC ....... *H03F 19/00* (2013.01); *H03F 2200/168* (2013.01)

(58) Field of Classification Search
CPC ...... H03F 19/00; H03F 2200/168; H03F 1/02; H03K 19/195
USPC ......................................... 330/250, 310, 302
See application file for complete search history.

(56) References Cited

U.S. PATENT DOCUMENTS

| 4,496,854 A * | 1/1985 | Chi ..................... G01R 33/0354 327/527 |
| 5,936,458 A | 8/1999 | Rylov |
| 7,724,083 B2 * | 5/2010 | Herring ................... H03F 19/00 330/56 |
| 10,651,808 B2 * | 5/2020 | Egan ......................... H03F 1/02 |
| 2019/0363688 A1 | 11/2019 | Egan et al. |

OTHER PUBLICATIONS

Koch, et al., "A NRZ-Output Amplifier for RSFQ Circuits", In Proceedings of IEEE Transaction on Applied Superconductivity, vol. 9, Issue 2, Jun. 1, 1999, pp. 3549-3552.
"International Search Report and Written Opinion Issued in PCT Application No. PCT/US22/017723", dated Jul. 7, 2022, 13 Pages.

* cited by examiner

*Primary Examiner* — Hieu P Nguyen
(74) *Attorney, Agent, or Firm* — Ranjeev Singh; Singh Law, PLLC

(57) ABSTRACT

Superconducting output amplifiers with interstage filters and related methods are described. An example superconducting output amplifier includes a first superconducting output amplifier stage and a second superconducting output amplifier stage. The superconducting output amplifier may further include a first terminal for receiving a first single flux quantum (SFQ) pulse train and coupling the SFQ pulse train to each of the first superconducting output amplifier stage and the second superconducting output amplifier stage. The superconducting output amplifier may further include an interstage filter comprising a damped Josephson junction (JJ) coupled between the first superconducting output amplifier stage and the second superconducting output amplifier stage, where the interstage filter is arranged to reduce distortion in an output voltage waveform generated by the superconducting output amplifier in response to at least the first SFQ pulse train.

20 Claims, 6 Drawing Sheets

200

SUPERCONDUCTING OUTPUT AMPLIFIERS WITH INTERSTAGE FILTERS

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based digital circuits is causing high power consumption even when these circuits are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based systems is the use of superconducting logic-based systems. Such superconducting logic-based systems may also be used in combination with CMOS technology based components. Superconducting logic-based systems may include output amplifiers, which need to be improved for the various drawbacks such output amplifiers may have.

SUMMARY

In one example, the present disclosure relates to a superconducting output amplifier including a first superconducting output amplifier stage and a second superconducting output amplifier stage. The superconducting output amplifier may further include a first terminal for receiving a first single flux quantum (SFQ) pulse train and coupling the SFQ pulse train to each of the first superconducting output amplifier stage and the second superconducting output amplifier stage. The superconducting output amplifier may further include an interstage filter comprising a damped Josephson junction (JJ) coupled between the first superconducting output amplifier stage and the second superconducting output amplifier stage, where the interstage filter is arranged to reduce distortion in an output voltage waveform generated by the superconducting output amplifier in response to at least the first SFQ pulse train.

In another aspect, a method for a superconducting output amplifier comprising a stack of a plurality of superconducting output amplifier stages is provided. The method may include receiving a first pulse train comprising a first plurality of single flux quantum (SFQ) pulses. The method may further include using the stack of the plurality of superconducting output amplifier stages, converting the first plurality of SFQ pulses into an output voltage waveform. The method may further include using interstage filters arranged among the plurality of superconducting output amplifier stages, reducing distortion in the output voltage waveform, where each of the interstage filters comprises a damped Josephson junction (JJ).

In yet another aspect, the present disclosure relates to a superconducting output amplifier including N superconducting output amplifier stages, where N is an integer equal to or greater than two. The superconducting output amplifier may further include a first terminal for receiving a first single flux quantum (SFQ) pulse train and coupling the first SFQ pulse train to each of the N superconducting output amplifier stages. The superconducting output amplifier may further include interstage filters, where each of the interstage filters comprises a damped Josephson junction (JJ), coupled between at least a subset of the N superconducting output amplifier stages, and where each of the interstage filters is arranged to reduce distortion in an output voltage waveform generated by the superconducting output amplifier in response to at least the first SFQ pulse train.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
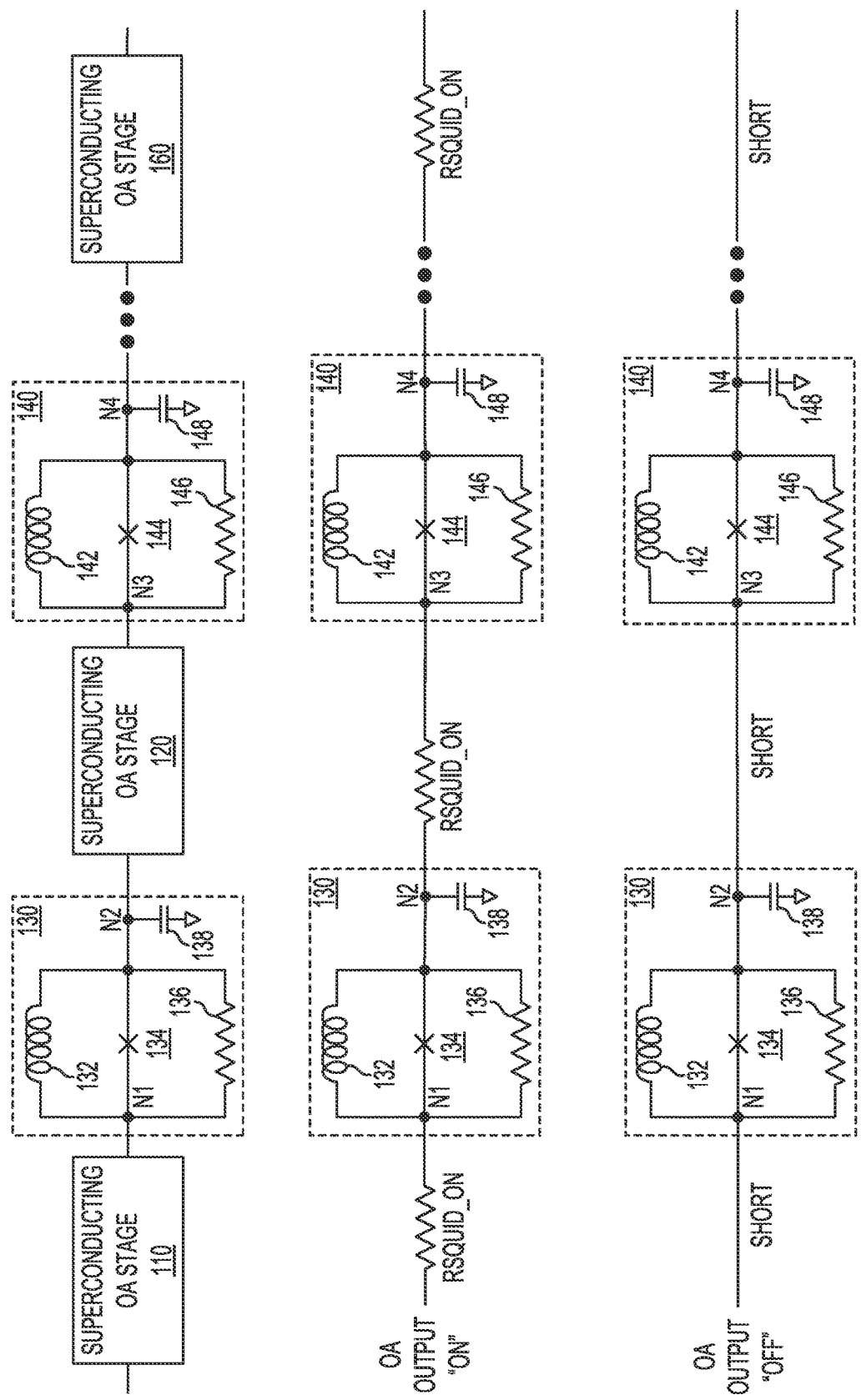
FIG. 1 is a diagram illustrating the operation of a superconducting output amplifier in accordance with one example.

Examples described in this disclosure relate to superconducting output amplifiers with interstage filters. Certain examples relate to output amplifiers having stacked direct current (DC)-superconducting quantum interference devices (SQUIDS) with the DC-SQUID output amplifier stages having interstage filters. A superconducting output amplifier with interstage filters may be implemented using any single flux quantum (SFQ) compatible logic. One example of such logic is quantum flux parametron (QFP). Another example of such logic is the reciprocal quantum logic (RQL). Thus, certain examples further relate to reciprocal quantum logic (RQL) compatible output amplifiers. Unlike CMOS transistors, the RQL circuits are superconductor circuits that use Josephson junction-based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

For RQL, using RZ data encoding, a logical "1" may be encoded as a positive SFQ pulse followed by a negative SFQ pulse occurring half a period later, and a logical "0" may be encoded as no pulses. Alternately, for RQL operating in "phase mode", the negative SFQ pulse may be delayed for an arbitrary number of clock cycles, but it may still be separated from the positive pulse by an odd number of half-clock cycles.

In superconducting logic-based systems, the output amplifier converts a positive going single-flux quantum, SFQ, input pulse into DC voltage. The subsequent negative going SFQ disables this output voltage. Since there are no controllable resistors available in superconducting logic-based systems, the DC voltage is created by filtering the output oscillations of the direct current (DC) superconducting quantum interference device (SQUID) output amplifier stages. A DC-SQUID output amplifier stage may consist of two Josephson junctions (JJs), connected in a loop via two inductors. An external DC current source may bias the DC-SQUID output amplifier stage at a particular DC operating point such that oscillations will occur when the additional magnetic flux is coupled, via an inductive coupling, into the loop formed with the JJs. As one of the JJs fires, it causes the other JJ in the loop to fire, which starts a positive feedback sequence resulting in the DC-SQUID loop oscillating. Each oscillation of the DC-SQUID output amplifier stage may release an SFQ voltage pulse which may then be averaged, via low-pass filters (LPFs) to create a smoothed DC voltage. The DC-SQUID output amplifier stages may be stacked serially to create a larger total output voltage, which is output by the output amplifier.

FIG. 1 is a diagram illustrating the operation of a superconducting output amplifier in accordance with one example. The operation of the superconducting output amplifier is illustrated using an equivalent circuit 100 for the superconducting output amplifier. Equivalent circuit 100 shows several serially connected superconducting output amplifier (OA) stages, including superconducting OA stage 110, superconducting OA stage 120, and superconducting OA stage 160. An interstage filter 130 is shown as coupled between superconducting OA stage 110 and superconducting OA stage 120. Another interstage filter 140 is shown as coupled between superconducting OA stage 120 and the next superconducting QA stage (not shown). The last superconducting OA stage 160 may be coupled to its respective interstage filter (not shown). Each superconducting OA stage may be implemented using one or more DC-superconducting quantum interference devices (DC-SQUIDs), Additional details of the superconducting OA stages are provided later.

With continued reference to FIG. 1, interstage filter 130 may include an inductor 132 coupled between nodes N1 and N2. Interstage filter 130 may further include a Josephson junction (JJ) 134 coupled between nodes N1 and N2 such that it is arranged in parallel with inductor 132. Interstage filter 130 may further include a resistor 136 coupled between nodes N1 and N2 such that it is coupled in parallel with inductor 132 and JJ 134. The combination of JJ 134 and resistor 136 forms a damped JJ. Interstage filter 130 may further comprise a capacitor 138 coupled between node N2 and a ground terminal. Similarly, interstage filter 140 may include an inductor 142 coupled between nodes N3 and N4. Interstage filter 140 may further include a JJ 144 coupled between nodes N3 and N4 such that it is arranged in parallel with inductor 142. Interstage filter 140 may further include a resistor 146 coupled between nodes N3 and N4 such that it is coupled in parallel with inductor 142 and JJ 144. The combination of JJ 144 and resistor 146 forms a damped JJ.

Interstage filter 140 may further comprise a capacitor 148 coupled between node N4 and the ground terminal.

In terms of the operation of the superconducting output amplifier, each superconducting OA stage may be in one of two states: "ON" or "OFF." In the "ON" state, the superconducting OA stage is generating a "high" output voltage when its constituent CSC-SQUIDS are oscillating. In the "OFF" state, the superconducting OA stage is inactive. In the "ON" state, the resistance terms associated with the superconducting OA stage may be represented as having a certain amount of resistance. In FIG. 1, this resistance is labeled as RSQUID_ON. This resistance reduces the Q factor of an equivalent circuit of the superconducting OA stage, and thus power is dissipated during the "ON" state. On the other hand, in the "OFF" state, the resistance terms may be represented as a "SHORT," which increases the Q factor of the superconducting OA stage, and thus there is very little or no power dissipation.

The variation in the Q factor results in different amount of ringing during the low-to-high signal transition versus the high-to-low signal transition. This difference in ringing distorts the output waveform generated by the output amplifier. An additional effect of the excess ringing is that the currents produced by the output amplifier may be coupled 'backwards' into the driver coupling the input signal to the superconducting OA stages. Such backward coupling of the current can cause the driver to fail and "re-trigger" one or more of the superconducting OA stages, and thus add to the distortion of the output waveform. The use of the interstage filters described with respect to FIG. 1, however, reduces the distortion of the output waveform generated by the superconducting output amplifier. The excess ringing is reduced because each of the damped JJs connected in parallel with a respective inductor acts as a nonlinear inductor as a function of the current flowing through the damped JJ. As the current that is flowing through the damped JJ builds up, its inductance goes up in a nonlinear fashion. Thus, as the current increases through the damped JJ increases, the damped JJ becomes more inductive, and in turn changes the equivalent resonance of the corresponding LC filter. As an example, when the inductance of damped JJ changes, the equivalent resonance of the LC filter formed by inductor 132 and capacitor 138 changes. However, when the current flowing through the damped JJ exceeds the critical current of the Josephson junction associated with the damped JJ, it triggers the damped JJ causing the inductance to literally disappear. In addition, the critical current of each of the damped JJ is also set so that a corresponding resistor (e.g., resistor 136 or resistor 146) absorbs the energy generated by the change in the state of the damped JJ. In one example, the resistance values for resistors 136 and 146 may be selected to achieve a certain βc number. The number may be represented by the equation $$\frac{R_n C}{\frac{L}{R_n}} = \frac{2\pi}{\Phi_0} I_c R_n^2 C,$$

where $R_n$ corresponds to the resistance values (e.g., the resistance values of resistors 136 or 146), C corresponds to the capacitance of the Josephson junction of the damped JJ, L corresponds to the inductance of the Josephson junction of the damped JJ, $I_c$ corresponds to the critical current of the Josephson junction of the damped JJ, and $\Phi_0$ corresponds to the flux quantum. In one example, an appropriate value for the $\beta_c$ number may be achieved by adjusting the resistance values (e.g., the resistance values for resistors 136 and 146) or the critical current value ($I_c$) such that the value of the critical current ($I_c$) multiplied by the resistance value is less than a certain value in milli-volts (e.g., 0.785 mV), With an appropriate value for the $\beta_c$ number, the interstage filters help reduce the variation in the Q factor of the equivalent circuit of the superconducting OA stage resulting in reduced ringing and less waveform distortion.

Figure 2:
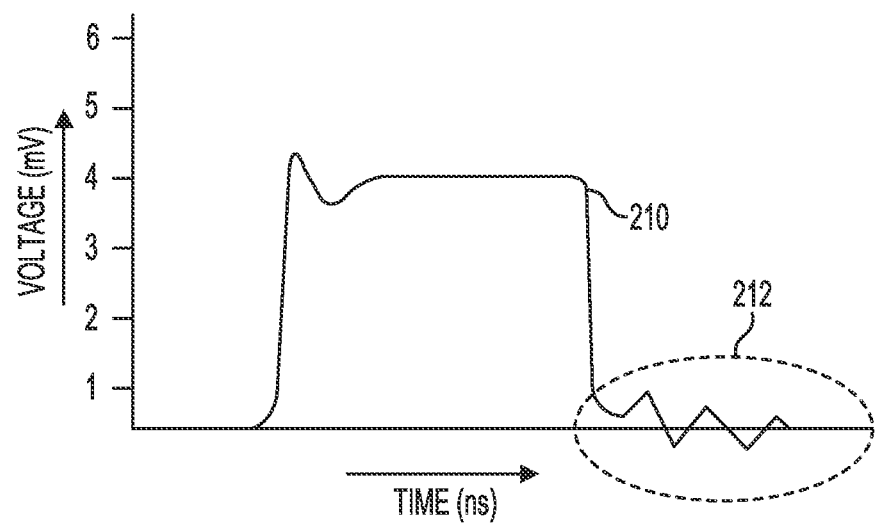
FIG. 2 shows a graph comparing the output waveform of a superconducting output amplifier that does not have interstage filters of the type shown in FIG. 1 with the output waveform of a superconducting output amplifier that does have interstage filters of the type shown in FIG. 1.
Figure 2:
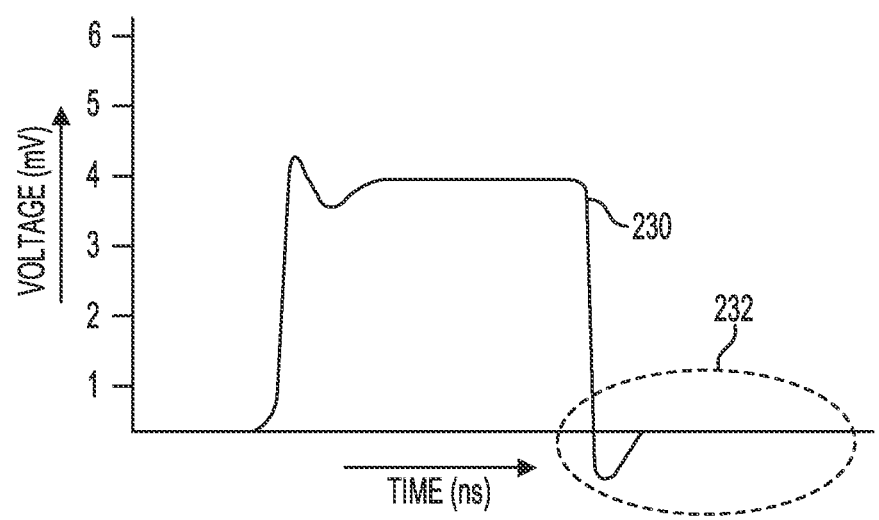

FIG. 2 shows a graph 200 comparing the output waveform 210 of a superconducting output amplifier that does not have interstage filters of the type shown in FIG. 1 with the output waveform 230 of a superconducting output amplifier that does have interstage filters of the type shown in FIG. 1. Each of output waveform 210 and 230 shows output voltage in milli-volts versus time in nanoseconds. As highlighted by the dotted ellipse 212, output waveform 210 has a higher amount of distortion than a comparative portion of output waveform 230, which is highlighted by the dotted ellipse 232.

Figure 3:
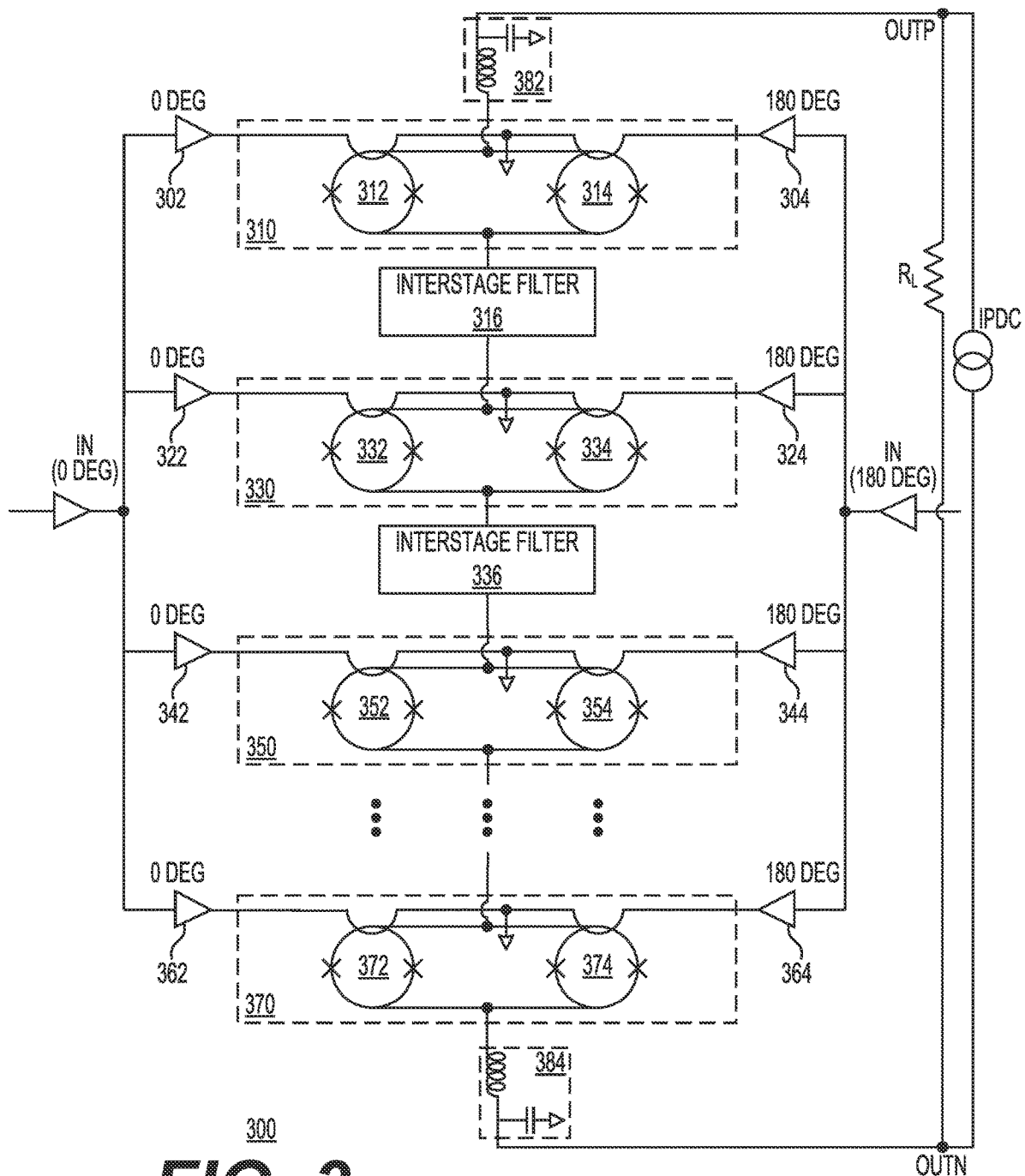
FIG. 3 shows a superconducting output amplifier with interstage filters in accordance with one example.

FIG. 3 shows a superconducting output amplifier 300 with interstage filters in accordance with one example. Superconducting output amplifier 300 may include a stack of superconducting output amplifier (OA) stages 310, 330, 350, and 370 connected in series. An interstage filter 316 may be coupled between superconducting OA stages 310 and 330. Another interstage filter 336 may be coupled between superconducting OA stages 330 and 350. Superconducting OA stage 310 may further be coupled via an LC filter 382 to the positive output voltage terminal (OUTP). Superconducting OA stage 370 may be coupled via another LC filter 384 to the negative output voltage terminal (OUTN). The load associated with superconducting output amplifier 300 is represented as a resistive load (RL). In addition, as shown in FIG. 3, a DC current source may be configured to provide a DC bias current (IPDC) to the superconducting OA stages of superconducting output amplifier 300.

With continued reference to FIG. 3, an input single flux quantum (SFQ) pulse train having a 0 degree phase may be coupled, via an input terminal (IN) to each of the superconducting output amplifier stages in the manner shown in FIG. 3. The SFQ pulse train may encode the digital data that needs to be amplified using the output amplifier. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. The SFQ pulse train may be coupled to superconducting OA amplifier stage 310 via a Josephson transmission line (JTL) 302. The SFQ pulse train may be coupled to superconducting OA amplifier stage 330 via a JTL 322, The SFQ pulse train may be coupled to superconducting OA amplifier stage 350 via a JTL 342. The SFQ pulse train may be coupled to superconducting OA amplifier stage 370 via a JTL 362.

Still referring to FIG. 3, another SFQ pulse train that has a 180 degree phase delay relative to the other SFQ pulse train may be coupled, via an input terminal (IN), to each of the superconducting output amplifier stages in the manner shown in FIG. 3, As an example, the 180 degree-delayed SFQ pulse train may be coupled to superconducting OA amplifier stage 310 via a JTL 304. The 180 degree-delayed SFQ pulse train may be coupled to superconducting OA amplifier stage 330 via a JTL 324. The 180 degree-delayed SFQ pulse train may be coupled to superconducting OA amplifier stage 350 via a JTL 344. The 180 degree-delayed SFQ pulse train may be coupled to superconducting OA amplifier stage 370 via a JTL 364. As described earlier, with respect to FIG. 1, each superconducting OA stage may generate a voltage output based on the oscillations associated with the DC-SQUIDs. The PDC current is set to a value that is sufficient to pre-bias the DC-SQUIDs but is not enough to trigger the Josephson junctions included as part of the DC-SQUIDs. Additional current is coupled to the DC-SQUIDs through the SFQ pulses received via the input terminal. The DC-SQUID fires when the current flowing through it exceeds the critical current of the JJs included as part of the DC-SQUID. The periodic firing of the DC-SQUIDs results in oscillations that are smoothed to generate the output voltage waveform.

As described earlier with respect to FIG. 1, the interstage filters may reduce the distortion of the output waveform produced by superconducting output amplifier 300. The LC filters may smooth the output voltage. Although FIG. 3 shows a certain number of components of superconducting output amplifier 300 arranged in a certain manner, there may be additional or fewer components arranged differently. Although FIG. 3 shows superconducting OA stages implemented using compound DC-SQUIDs, each of these superconducting output amplifier stages may be implemented using a single DC-SQUID. As an example, although FIG. 3 shows interstage filters coupled between all superconducting OA stages, interstage filters may be coupled only between a subset of the superconducting OA stages. In one example, assuming superconducting output amplifier 300 includes 32 stacked superconducting OA stages, the interstage filters may be coupled only between those superconducting OA stages that are towards the middle of the stack (e.g., counting from the top, interstage filters may only be coupled between stages 10 and 11, 11 and 12, 12 and 13, 14, and 15, 15, and 16, 16 and 17, 17 and 18, 18 and 19, 19 and 20, 20 and 21). In addition, although FIG. 3 shows superconducting output amplifier 300 as receiving two SFQ pulse trains one of which is delayed relative to the other, the same SFQ pulse train may be coupled to each of the input terminals such that other components associated with superconducting output amplifier 300 may be used to create the same effective delay. Two clocks that are 90 degrees out of phase may also be used. Alternatively, a four-phase clock may be used. The four-phase clock may be derived by coupling the clock lines to the Josephson junctions in the gates of a respective superconducting circuit in a wound or counter-wound fashion. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation. Moreover, the input SFQ pulses may be distributed via a tree-like distribution network, a vine-like distribution network, or a hybrid distribution network including some combination of both the tree-like distribution network and the vine-like distribution network. Such networks may be formed using multiple JTLs. In addition, prior to the SFQ pulses being coupled with a respective DC-SQUID, the pulses may be driven using a respective driver.

Figure 4:
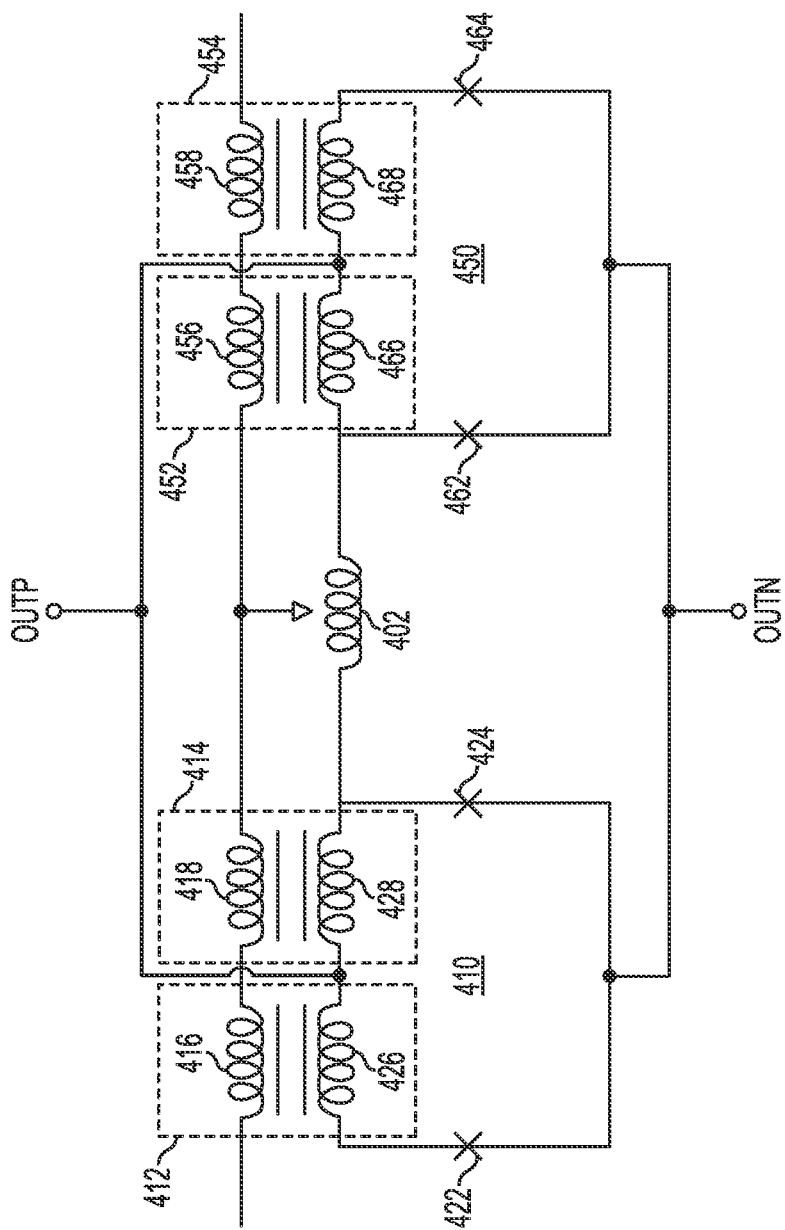
FIG. 4 shows a circuit diagram of an example superconducting OA stage for use with superconducting output amplifier of FIG. 3.

FIG. 4 shows a circuit diagram of an example superconducting OA stage 400 for use with superconducting output amplifier 300 of FIG. 1. In this example, superconducting OA stage 400 may receive a first pulse train comprising single flux quantum (SFQ) pulses via an input terminal (IN). Superconducting OA stage 400 may receive a second pulse train comprising SFQ pulses via another input terminal (IN). The second pulse train may be delayed relative to the first pulse train by half a clock cycle. With respect to reciprocal quantum logic (RQL) compatible SFQ pulses, this may correspond to a 180 degrees phase difference between the two pulse trains. In one example, a resonator clock source may provide a sinusoidal or an alternating current (AC) clock that may both clock and provide power to compound superconducting OA stage 400. Superconducting QA stage 400 may include a DC-SQUID 410 and a DC-SQUID 450, which may be coupled via an inductor 402. The input SFQ pulses may be coupled to DC-SQUID 410 via transformers 412 and 414. The input SFQ pulses may be coupled to DC-SQUID 450 via transformers 452 and 454. Superconducting OA stage 400 may provide a positive output voltage at the OUTP terminal and a negative output voltage at the OUTN terminal. DC-SQUID 410 may include two Josephson junctions (JJs) 422 and 424, which may be coupled in a loop via inductors 426 and 428. DC-SQUID 450 may include two JJs 462 and 466, which may be coupled in a loop via inductors 466 and 468. An external DC current source (not shown) may bias each of DC-SQUID 410 and DC-SQUID 450 at a particular operating point such that the DC-SQUIDS may oscillate when additional magnetic flux is applied to the respective loops. The inductive coupling between inductors 416 and 426 and the inductive coupling between inductors 418 and 428 may provide additional magnetic flux to DC-SQUID 410. As one of the JJs (e.g., one of JJ 422 or JJ 424) fires, it causes the other JJ (e.g., one of JJ 422 or JJ 424) in the loop (e.g., the loop corresponding to DC-SQUID 410) to fire, which starts a positive feedback sequence resulting in the DC-SQUID loop oscillating. The inductive coupling between inductors 456 and 466 and the inductive coupling between inductors 458 and 468 may provide additional magnetic flux to DC-SQUID 410. As one of the JJs (e.g., one of JJ 462 or JJ 464) fires, it causes the other JJ (e.g., one of JJ 462 or JJ 464) in the loop (e.g., the loop corresponding to DC-SQUID 450) to fire, which starts a positive feedback sequence resulting in the DC-SQUID loop oscillating. Each oscillation of the DC-SQUIDS may release a voltage pulse. Although FIG. 4 shows a certain number of components of superconducting OA stage 400 arranged in a certain manner, there could be more or fewer number of components arranged differently.

Figure 5:
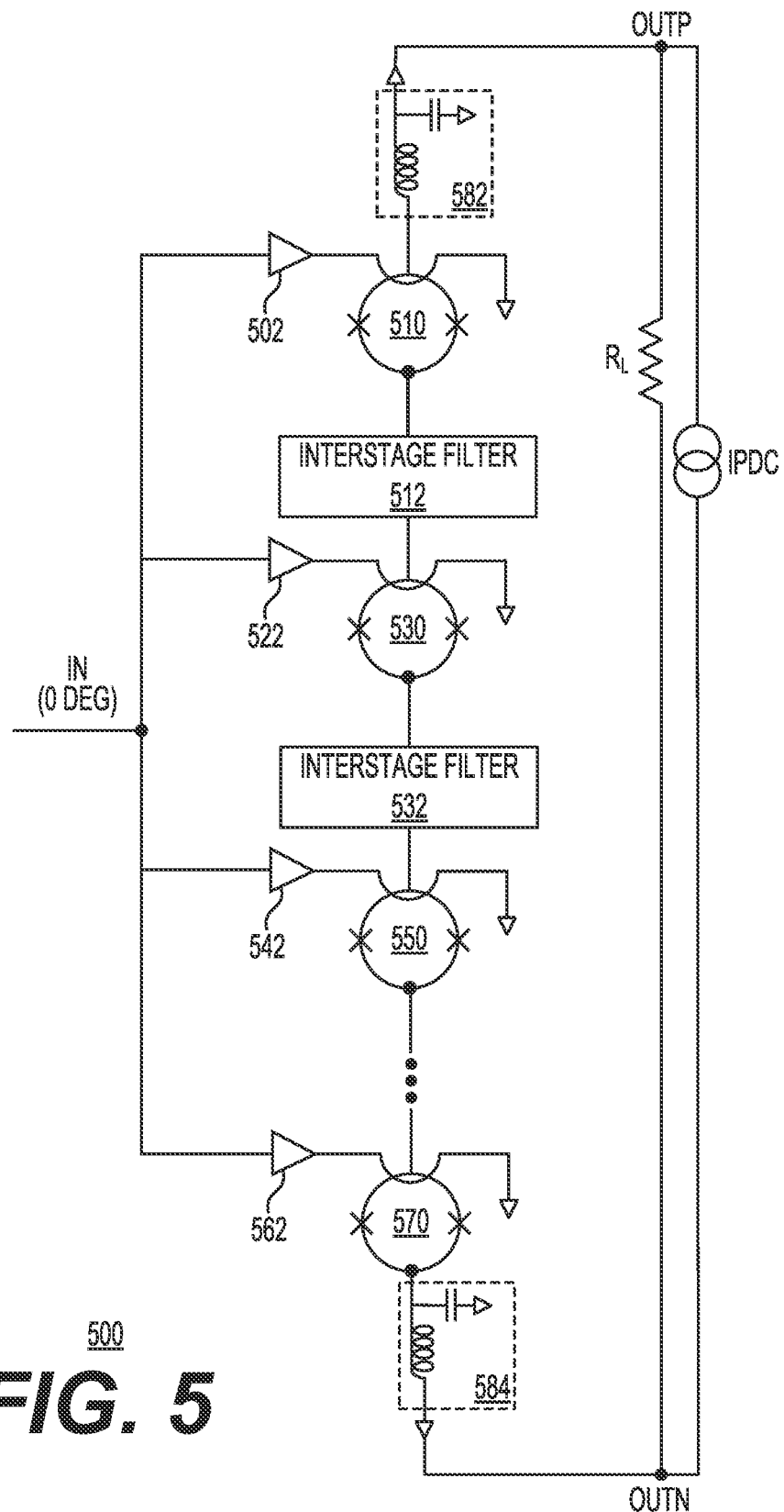
FIG. 5 shows a superconducting output amplifier with interstage filters in accordance with another example.

FIG. 5 shows a superconducting output amplifier 500 with interstage filters in accordance with one example. Superconducting output amplifier 500 may include a stack of superconducting output amplifier (OA) stages 510, 530, 550, and 570 connected in series. An interstage filter 512 may be coupled between superconducting OA stages 510 and 530. Another interstage filter 532 may be coupled between superconducting OA stages 530 and 550. Superconducting OA stage 510 may further be coupled via an LC filter 582 to the positive output voltage terminal (OUTP). Superconducting OA stage 570 may be coupled via another LC filter 584 to the negative output voltage terminal (OUTN). The load associated with superconducting output amplifier 500 is represented as a resistive load (RL). In addition, as shown in FIG. 5, a DC current source may be configured to provide a DC bias current (IPDC) to the superconducting OA stages of superconducting output amplifier 500.

With continued reference to FIG. 5, an input single flux quantum (SFQ) pulse train having a 0 degree phase may be coupled, via an input terminal (IN) to each of the superconducting output amplifier stages in the manner shown in FIG.

5. The SFQ pulse train may encode the digital data that needs to be amplified using the output amplifier. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. The SFQ pulse train may be coupled to superconducting OA amplifier stage 510 via a Josephson transmission line (JTL) 502. The SFQ pulse train may be coupled to superconducting OA amplifier stage 530 via a JTL 522. The SFQ pulse train may be coupled to superconducting OA amplifier stage 550 via a JTL 542. The SFQ pulse train may be coupled to superconducting OA amplifier stage 570 via a JTL 562, In this example, each superconducting OA amplifier stage includes only a single DC-SQUID, whose oscillations are converted into a voltage waveform. The IPDC current is set to a value that is sufficient to pre-bias each DC-SQUID but is not enough to trigger the Josephson junctions included as part of the DC-SQUIDs. Additional current is coupled to the DC-SQUIDS through the SFQ pulses received via the input terminal. The DC-SQUID fires when the current flowing through it exceeds the critical current of the JJs included as part of the DC-SQUID. The periodic firing of the DC-SQUIDS results in oscillations that are smoothed to generate the output voltage waveform.

As described earlier with respect to FIG. 1, the interstage filters may reduce the distortion of the output waveform produced by superconducting output amplifier 500. The LC filters may further smooth the output voltage. Although FIG. 5 shows a certain number of components of superconducting output amplifier 500 arranged in a certain manner, there may be additional or fewer components arranged differently. As an example, although FIG. 5 shows interstage filters coupled between all superconducting OA stages, interstage filters may be coupled only between a subset of the superconducting OA stages. In one example, assuming superconducting output amplifier 500 includes 32 stacked superconducting OA stages, the interstage filters may only be coupled only between those superconducting QA stages that are towards the middle of the stack (e.g., counting from the top, interstage filters may only be coupled between stages 10 and 11, 11 and 12, 12 and 13, 14, and 15, 15, and 16, 16 and 17, 17 and 18, 18 and 19, 19 and 20, 20 and 21). Moreover, the input SFQ pulses may be distributed via a tree-like distribution network, a vine-like distribution network, or a hybrid distribution network including some combination of both the tree-like distribution network and the vine-like distribution network. Such networks may be formed using multiple JTLs. In addition, prior to the SFQ pulses being coupled with a respective DC-SQUID, the pulses may be driven using a respective driver.

Figure 6:
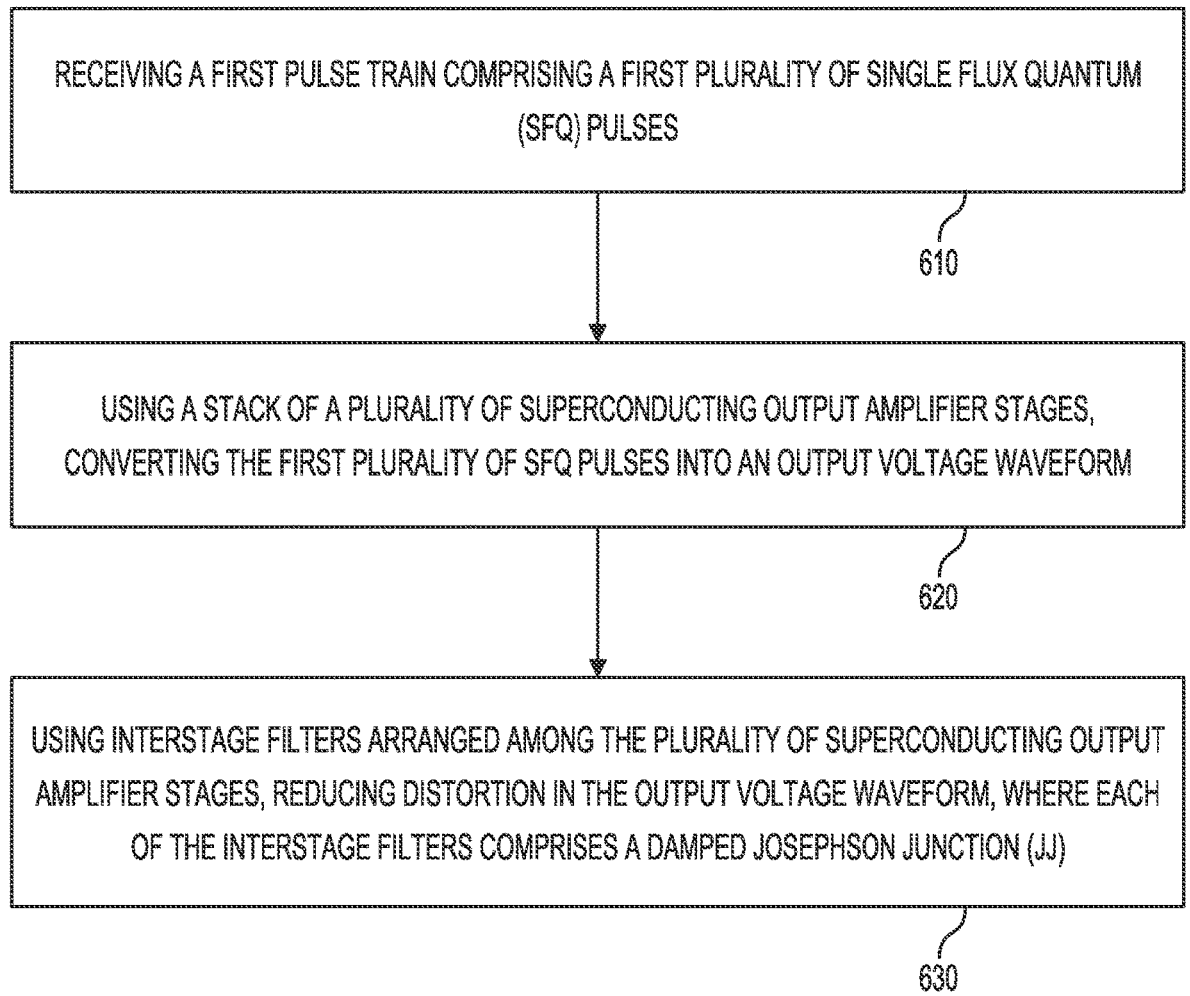
FIG. 6 shows a flow chart for a method related to a superconducting output amplifier in accordance with one example.

FIG. 6 shows a flow chart 600 for a method related to a superconducting output amplifier in accordance with one example. In this example, the method may be performed by the either one of the superconducting output amplifiers described with respect to FIG. 3 or FIG. 5. Step 610 may include the superconducting output amplifier receiving a first pulse train comprising a first plurality of single flux quantum (SFQ) pulses.

Step 620 may include using the stack of the plurality of superconducting output amplifier stages, converting the first plurality of SFQ pulses into an output voltage waveform. As explained earlier, superconducting output amplifier 300 and superconducting output amplifier 500 include superconducting amplifier OA stages that can convert the SFQ pulses into an output voltage waveform using DC-SQUIDs.

Step 630 may include using interstage filters arranged among the plurality of superconducting output amplifier stages, reducing distortion in the output voltage waveform, wherein each of the interstage filters comprises a damped Josephson junction (JJ). The functionality and the arrangement of the interstage filters is explained earlier with respect to FIGS. 1-5. Any of the previously described superconducting output amplifiers with interstage filters may be used to perform this step.

In conclusion, in one example, the present disclosure relates to a superconducting output amplifier including a first superconducting output amplifier stage and a second superconducting output amplifier stage. The superconducting output amplifier may further include a first terminal for receiving a first single flux quantum (SFQ) pulse train and coupling the SFQ pulse train to each of the first superconducting output amplifier stage and the second superconducting output amplifier stage. The superconducting output amplifier may further include an interstage filter comprising a damped Josephson junction (JJ) coupled between the first superconducting output amplifier stage and the second superconducting output amplifier stage, where the interstage filter is arranged to reduce distortion in an output voltage waveform generated by the superconducting output amplifier in response to at least the first SFQ pulse train.

The damped JJ may include a Josephson junction (JJ) coupled in parallel with a resistor. The interstage filter may further comprise an inductor coupled in parallel with the damped JJ. The interstage filter may further comprise a capacitor coupled to the inductor to form an LC-filter.

The first superconducting output amplifier stage may comprise at least a first direct current-superconducting quantum interference device (DC-SQUID), and the second superconducting output amplifier stage may comprise at least a second DC-SQUID. The superconducting output amplifier may further comprise an external direct current (DC) source configured to pre-bias each of the first DC-SQUID and the second DC-SQUID. The superconducting output amplifier may further comprise a second terminal for receiving a second SFQ pulse train, where the second SFQ pulse train is delayed by a predetermined fraction of a dock cycle relative to the first SFQ pulse train, and where the output voltage waveform is generated by the superconducting output amplifier in response to at least both the first SFQ pulse train and the second SFQ pulse train.

In another aspect, a method for a superconducting output amplifier comprising a stack of a plurality of superconducting output amplifier stages is provided. The method may include receiving a first pulse train comprising a first plurality of single flux quantum (SFQ) pulses. The method may further include using the stack of the plurality of superconducting output amplifier stages, converting the first plurality of SFQ pulses into an output voltage waveform. The method may further include using interstage filters arranged among the plurality of superconducting output amplifier stages, reducing distortion in the output voltage waveform, where each of the interstage filters comprises a damped Josephson junction (JJ).

The damped JJ may include a Josephson junction (JJ) coupled in parallel with a resistor. The interstage filter may further comprise an inductor coupled in parallel with the damped JJ. The interstage filter may further comprise a capacitor coupled to the inductor to form an LC-filter.

Each of the plurality of superconducting output amplifier stages may comprise at least one direct current-superconducting quantum interference device (DC-SQUID), The method may further include using an external direct current (DC) source pre-biasing the at least one DC-SQUID. The method may further include receiving a second pulse train comprising a second plurality of SFQ pulses, where the second pulse train is delayed by a predetermined fraction of a clock cycle relative to the first pulse train.

In yet another aspect, the present disclosure relates to a superconducting output amplifier including N superconducting output amplifier stages, where N is an integer equal to or greater than two. The superconducting output amplifier may further include a first terminal for receiving a first single flux quantum (SFQ) pulse train and coupling the first SFQ pulse train to each of the N superconducting output amplifier stages. The superconducting output amplifier may further include interstage filters, where each of the interstage filters comprises a damped Josephson junction (JJ), coupled between at least a subset of the N superconducting output amplifier stages, and where each of the interstage filters is arranged to reduce distortion in an output voltage waveform generated by the superconducting output amplifier in response to at least the first SFQ pulse train.

The damped JJ may include a Josephson junction (JJ) coupled in parallel with a resistor. Each of the interstage filters may further comprise an inductor coupled in parallel with the damped JJ. Each of the interstage filter may further comprise a capacitor coupled to the inductor to form an LC-filter.

Each of the N superconducting output amplifier stages may comprise at least one direct current-superconducting quantum interference device (DC-SQUID). The superconducting output amplifier may further include a second terminal for receiving a second SFQ pulse train, where the second SFQ pulse train is delayed by a predetermined fraction of a clock cycle relative to the first SFQ pulse train, and where the output voltage waveform is generated by the superconducting output amplifier in response to at least both the first SFQ pulse train and the second SFQ pulse train.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with, transmission media. Transmission media is used for transferring data and/or instruction to or from a machine, Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting output amplifier comprising:
   a first superconducting output amplifier stage;
   a second superconducting output amplifier stage;
   a first terminal for receiving a first single flux quantum (SFQ) pulse train and coupling the SFQ pulse train to each of the first superconducting output amplifier stage and the second superconducting output amplifier stage; and
   an interstage filter comprising a damped Josephson junction (JJ) coupled between the first superconducting output amplifier stage and the second superconducting output amplifier stage, wherein the interstage filter is arranged to reduce distortion in an output voltage waveform generated by the superconducting output amplifier in response to at least the first SFQ pulse train.

2. The superconducting output amplifier of claim 1, wherein the damped JJ comprises a Josephson junction (JJ) coupled in parallel with a resistor.

3. The superconducting output amplifier of claim 2, wherein the interstage filter comprises an inductor coupled in parallel with the damped JJ.

4. The superconducting output amplifier of claim 3, wherein the interstage filter further comprises a capacitor coupled to the inductor to form an LC-filter.

5. The superconducting output amplifier of claim 1, wherein the first superconducting output amplifier stage comprises at least a first direct current-superconducting quantum interference device (DC-SQUID), and wherein the second superconducting output amplifier stage comprises at Fast a second DC-SQUID.

6. The superconducting output amplifier of claim 5, further comprising an external direct current (DC) source configured to pre-bias each of the first DC-SQUID and the second DC-SQUID.

7. The superconducting output amplifier of claim 1, further comprising a second terminal for receiving a second SFQ pulse train, wherein the second SFQ pulse train is delayed by a predetermined fraction of a clock cycle relative to the first SFQ pulse train, and wherein the output voltage waveform is generated by the superconducting output amplifier in response to at least both the first SFQ pulse train and the second SFQ pulse train.

8. A method for a superconducting output amplifier comprising a stack of a plurality of superconducting output amplifier stages, the method comprising:
receiving a first pulse train comprising a first plurality of single flux quantum (SFQ) pulses;
using the stack of the plurality of superconducting output amplifier stages, converting the first plurality of SFQ pulses into an output voltage waveform; and
using interstage filters arranged among the plurality of superconducting output amplifier stages, reducing distortion in the output voltage waveform, wherein each of the interstage filters comprises a damped Josephson junction (JJ).

9. The method of claim 8, wherein the damped JJ comprises a Josephson junction (JJ) coupled in parallel with a resistor.

10. The method of claim 9, wherein the interstage filter comprises an inductor coupled in parallel with the damped JJ.

11. The method of claim 10, wherein the interstage filter further comprises a capacitor coupled to the inductor to form an LC-filter.

12. The method of claim 8, wherein each of the plurality of superconducting output amplifier stages comprises at least one direct current-superconducting quantum interference device (DC-SQUID).

13. The method of claim 12, further comprising using an external direct current (DC) source pre-biasing the at least one DC-SQUID.

14. The method of claim 8, further comprising receiving a second pulse train comprising a second plurality of SFQ pulses, wherein the second pulse train is delayed by a predetermined fraction of a clock cycle relative to the first pulse train.

15. A superconducting output amplifier comprising:
N superconducting output amplifier stages, wherein N is an integer equal to or greater than two;
a first terminal for receiving a first single flux quantum (SFQ) pulse train and coupling the first SFQ pulse train to each of the N superconducting output amplifier stages; and
interstage filters, wherein each of the interstage filters comprises a damped Josephson junction (JJ), coupled between at least a subset of the N superconducting output amplifier stages, and wherein each of the interstage filters is arranged to reduce distortion in an output voltage waveform generated by the superconducting output amplifier in response to at least the first SFQ pulse train.

16. The superconducting output amplifier of claim 15, wherein the damped JJ comprises a Josephson junction (JJ) coupled in parallel with a resistor.

17. The superconducting output amplifier of claim 16, wherein each of the interstage filters comprises an inductor coupled in parallel with the damped JJ.

18. The superconducting output amplifier of claim 17, wherein each of the interstage filters further comprises a capacitor coupled to the inductor to form an LC-filter.

19. The superconducting output amplifier of claim 15, wherein each of the N superconducting output amplifier stages comprises at least one direct current-superconducting quantum interference device (DC-SQUID).

20. The superconducting output amplifier of claim 15, further comprising a second terminal for receiving a second SFQ pulse train, wherein the second SFQ pulse train is delayed by a predetermined fraction of a clock cycle relative to the first SFQ pulse train, and wherein the output voltage waveform is generated by the superconducting output amplifier in response to at least both the first SFQ pulse train and the second SFQ pulse train.

* * * * *